United States Patent
Amaratunga et al.

(10) Patent No.: US 6,693,340 B1
(45) Date of Patent: Feb. 17, 2004

(54) LATERAL SEMICONDUCTOR DEVICE

(75) Inventors: Gehan Anil Joseph Amaratunga, Cambridge (GB); Ranick Kian Ming Ng, Cambridge (GB); Florin Udrea, Cambridge (GB)

(73) Assignees: Fuji Electric Co., Ltd., Kanagawa (JP); Cambridge University Technical Services Limited, Cambridge (GB)

( * ) Notice: Subject to any disclaimer, the term of this patent is extended or adjusted under 35 U.S.C. 154(b) by 26 days.

(21) Appl. No.: 09/870,040

(22) Filed: May 30, 2001

(30) Foreign Application Priority Data

May 11, 2001 (GB) ............................................. 0111556

(51) Int. Cl.$^7$ .............................................. H01L 23/58
(52) U.S. Cl. ...................... 257/493; 257/492; 257/496; 257/409; 257/339; 257/629
(58) Field of Search ................................ 257/493, 492, 257/496, 409, 629, 339

(56) References Cited

U.S. PATENT DOCUMENTS

| | | | |
|---|---|---|---|
| 5,438,215 A | | 8/1995 | Tihanyi ........................ 257/401 |
| 5,592,014 A | | 1/1997 | Funaki et al. ................ 257/487 |
| 5,631,491 A | * | 5/1997 | Matsuzaki .................... 257/487 |
| 6,023,090 A | | 2/2000 | Letavic et al. ............... 257/347 |
| 6,127,703 A | | 10/2000 | Letavic et al. ............... 257/347 |
| 6,177,704 B1 | * | 1/2001 | Suzuki et al. ................ 257/343 |
| 6,294,818 B1 | * | 9/2001 | Fujihira ....................... 257/409 |

FOREIGN PATENT DOCUMENTS

| JP | 8316469 | | 11/1996 |
|---|---|---|---|
| JP | 2000156495 A | * | 6/2000 |

OTHER PUBLICATIONS

F. Udrea et al, "3D *Resurf Double–Gate MOSFET: A revolutionary power device concept*", Electronic Letters, 5 vol. 34, No. 8, , 808–809(1998).

T. Fujihira and Y. Miyasaka, "*Simulated Superior Performances of Semiconductor Superjunction Devices*", ISPSD 98, 423–426, (1998).

T. Fujihira, "*Theory of Semiconductor Superjunction Devices*",Jpn Journal of Applied Physics, vol. 36, 6254–6262, (1997).

S. Merchant et al, "*Realisation of High Breakdown Voltage (5700 volts) in Thin SOI Devices*", ISPSD 91, 31–35 (1991).

British Patent Office Search Report for Application N. GB 0111556.7, dated Jan. 16, 2003 (1 p.).

* cited by examiner

*Primary Examiner*—Nathan J. Flynn
*Assistant Examiner*—Remmon R. Fordé
(74) *Attorney, Agent, or Firm*—Conley Rose, P.C.

(57) ABSTRACT

A lateral semiconductor device has a semiconductor layer on an insulating layer on a semiconductor substrate. The semiconductor layer has a region of a first conduction type and a region of a second conduction type with a drift region therebetween. The drift region is provided by a region of the first conduction type and a region of the second conduction type. The first and second conduction type drift regions are so arranged that when a reverse voltage bias is applied across the first and second conduction type regions of the semiconductor layer, the second conduction type drift region has an excess of charge relative to the first conduction type drift region which varies substantially linearly from the end of the drift region towards the first conduction type region of the semiconductor layer to the end of the drift region towards the second conduction type region of the semiconductor layer.

18 Claims, 8 Drawing Sheets

LATERAL SEMICONDUCTOR DEVICE

CROSS-REFERENCE TO RELATED APPLICATIONS

This application claims benefit of priority to British application Serial No. GB0111556.7, filed May 11, 2001.

STATEMENT REGARDING FEDERALLY SPONSORED RESEARCH OR DEVELOPMENT

Not applicable.

TECHNICAL FIELD OF THE INVENTION

The present invention relates to a lateral semiconductor device.

The present invention relates generally to the field of high voltage semiconductor devices and more particularly to high voltage lateral devices manufactured by the use of SOI (Silicon-on-Insulator) technology.

BACKGROUND OF THE INVENTION

As shown schematically in FIG. 1, a typical lateral high-voltage device 1 fabricated using SOI technology has a basic configuration of a p+ region 2 and an n+ region 3 at opposing ends separated by a central n drift region 4 of lower conductivity, all of which are formed in an SOI layer 5 which is formed on an oxide layer 6 which itself is formed on a silicon substrate 7. The p+ region 2 is shorted to the substrate 7 below the BOX (buried oxide layer) 6. In the blocking/off-state mode, a terminal (not shown) connecting the p+ region 2 and the substrate 7 is grounded and a high voltage reverse bias is applied to a terminal (not shown) connected to the n+ region 3. As the reverse bias is increased, a depletion layer develops across the p+/n junction 2/4. The bulk of the depletion layer forms within the central n region 4 so that a significant portion of the applied reverse bias is sustained inside the central n region 4. Simultaneously, due to a field effect action across the buried oxide 6, an inversion/accumulation layer forms directly beneath the buried oxide layer 6 in the p or n type substrate 7. This layer of highly mobile charge maintains an equipotential surface at ground potential beneath the buried oxide layer 6 and screens nearly all of the electric field from the bulk of the substrate 7 and behaves in effect as a field plate. The field plate effect causes a crowding of the potential lines in the area surrounding the n+ region 3 which, during the blocking state, is connected to the reverse bias. The electric field inside the depleted region of the central n region 4 is thus distorted and results in the formation of a second electric field peak near the n+ region 3 in addition to the original electric field peak occurring at the p+/n junction 2/4. This is the so-called "RESURF" phenomenon observed in high voltage SOI devices. Unlike the RESURF effect in Junction Isolation (JI) technology, the RESURF effect in SOI is weak and this is mainly because the buried oxide layer 6 prevents a direct coupling of fixed ion charge between the substrate 7 and the upper SOI layer 5. The absence of this coupling excludes the formation of a depletion layer within the substrate 7. Thus, in such devices, the high voltage sustaining capability must come from either the SOI 5 or the buried oxide layer 6.

In the past, methods for achieving high blocking voltages have relied on a relatively thick SOI layer 5 to support the reverse bias. For instance, to reach 500 Volts, the SOI layer 5 should typically have a depth of 10 to 20 μm. However, if for example a SOI layer 5 in excess of 5 μm thickness is ruled out because of isolation problems, then the reverse bias must be supported almost entirely by the buried oxide layer 6.

Consider now the electric field at the SOI/BOX interface 5/6 for the device 1 in FIG. 1. In the ideal case, the horizontal component of the electric field at this interface will be constant, and the voltage along the line AB in FIG. 1 will increase linearly towards B. Since the reverse bias is mainly supported by the oxide layer 6, it follows that the vertical component of the electric field at the interface and within the oxide layer 6 must also increase linearly along AB. Thus, the main criterion for a perfect electric field distribution in SOI layers 5 of thin to medium thickness translates to the requirement of a vertical electric field ξy at the SOI/BOX interface which is proportional to distance from the grounded end A.

One way of achieving this is by use of a thin linearly graded profile in the n drift region 4. Furthermore, if the horizontal electric field distribution is constant, then any electric field due to the charge in the SOI layer 5 along a vertical line must terminate at the layer of mobile charges formed at the substrate/BOX interface 7/6. This allows the vertical electric field distribution along any vertical line in the SOI layer 5 to be approximated as a triangular distribution. Another way of obtaining a linear distribution of the vertical electric field along the SOI/BOX interface 5/6 is via the use of a tapered or stepped buried oxide layer 6.

Referring again to FIG. 1, applying Gauss's law along the line BC at the high voltage end, the required distribution of the vertical electric field in the SOI layer 5 along the SOI/BOX interface 5/6 can be deduced as:

$$\xi_y(x) = \frac{\varepsilon_{ox} V_{br}}{\varepsilon_{si} t_{ox}} \left( \frac{x}{L_{drift}} \right) \quad (1)$$

and the corresponding doping profile is given by, $$N_{SOI}(x) = \frac{\varepsilon_{ox} V_{br}}{q t_{soi} t_{ox}} \left( \frac{x}{L_{drift}} \right). \quad (2)$$

Because the electric field at the SOI/BOX interface 5/6 can be high, especially in high voltage devices, a thin SOI layer 5 must in practice be used as it allows a higher critical electric field to be sustained across it. FIG. 2 shows, for several doping concentrations, how the critical electric field in silicon increases as the thickness of the silicon is reduced.

S. Merchant, E. Arnold, S. Mukherjee, H. Pein and R. Pinker, "Realisation of High Breakdown Voltage (≦700 volts) in Thin SOI Devices", ISPSD 91, p. 31 describe a previous attempt to achieve a uniform surface electric field distribution and exploit the voltage-supporting capability of the buried oxide by the use of a linearly graded doping profile in an ultra-thin (<1 μm) SOI layer. In accordance with equation (1) above, the doping profile increases from the grounded p+ region towards the n+ region connected to the reverse bias. In another attempt to achieve greater uniformity of the electric field distribution, F. Udrea et al in "3D RESURF Double-Gate MOSFET: A revolutionary power device concept", Electronic Letters, vol.34, no.8, April 1998, propose the use of parallel, alternating n and p stripes in the SOI region, in which the charge in the n stripe balances exactly the charge in the p stripe. However, use of charge-balanced, parallel n and p stripes results in large electric field peaks at the n+ and p+ ends.

In practice, it is difficult to fabricate a device in which the doping profile of any region varies uniformly linearly as required by these prior art proposals.

SUMMARY OF THE INVENTION

According to a first aspect of the present invention, there is provided a lateral semiconductor device, the device comprising a semiconductor layer on an insulating layer on a semiconductor substrate, the semiconductor layer having a region of a first conduction type and a region of a second conduction type with a drift region therebetween, the drift region being provided by a region of the first conduction type and a region of the second conduction type, the first and second conduction type drift regions being so arranged that when a reverse voltage bias is applied across the first and second conduction type regions of the semiconductor layer, the second conduction type drift region has an excess of charge relative to the first conduction type drift region which varies substantially linearly from the end of the drift region towards the first conduction type region of the semiconductor layer to the end of the drift region towards the second conduction type region of the semiconductor layer.

According to a second aspect of the present invention, there is provided a lateral semiconductor device, the device comprising a semiconductor layer on an insulating layer on a semiconductor substrate, the semiconductor layer having a region of a first conduction type and a region of a second conduction type with a drift region therebetween, the drift region being provided by a region of the first conduction type and a region of the second conduction type, a junction formed between the first and second conduction type drift regions lying at an acute angle to a line joining the first and second conduction type regions of the semiconductor layer with a major portion of the first conduction type drift region being towards the first conduction type region of the semiconductor layer and a major portion of the second conduction type drift region being towards the second conduction type region of the semiconductor layer, whereby when a reverse voltage bias is applied across the first and second conduction type regions of the semiconductor layer, the second conduction type drift region has an excess of charge relative to the first conduction type drift region which varies substantially linearly from the end of the drift region towards the first conduction type region of the semiconductor layer to the end of the drift region towards the second conduction type region of the semiconductor layer.

According to a third aspect of the present invention, there is provided a lateral semiconductor device, the device comprising a semiconductor layer on an insulating layer on a semiconductor substrate, the semiconductor layer having a region of a first conduction type and a region of a second conduction type with a drift region therebetween, the drift region being provided by a region of the first conduction type and an adjacent region of the second conduction type, the first and second conduction type drift regions each being tapered with a major portion of the first conduction type drift region being towards the first conduction type region of the semiconductor layer and a major portion of the second conduction type drift region being towards the second conduction type region of the semiconductor layer, whereby when a reverse voltage bias is applied across the first and second conduction type regions of the semiconductor layer, the second conduction type drift region has an excess of charge relative to the first conduction type drift region which varies substantially linearly from the end of the drift region towards the first conduction type region of the semiconductor layer to the end of the drift region towards the second conduction type region of the semiconductor layer.

The present invention provides a lateral semiconductor device, which in the preferred embodiment is of the SOI type, in which a high blocking voltage capability can be achieved but without requiring a non-uniform doping profile in any of the regions of the device. By providing (at least) first and second conduction type drift regions, an excess of charge can form in one of the first and second conduction type drift regions relative to the other when a reverse bias is applied across the device. In the preferred embodiment, by appropriate arrangement of the geometry of the first and second conduction type drift regions, that excess of charge can effectively simulate the non-uniform doping profile in the prior art proposal discussed above, thus providing the desired increase in the vertical electric field along the device discussed above.

The first conduction type drift region may be substantially triangular or trapezoidal in shape parallel to the plane of the device.

The second conduction type drift region may be substantially triangular or trapezoidal in shape parallel to the plane of the device.

The first conduction type drift region preferably has substantially uniform doping. The second conduction type drift region preferably has substantially uniform doping. Whilst not strictly necessary to achieve the desired excess charge and substantially linear variation along the device, uniform doping profiles are much easier to fabricate controllably and reproducibly and are also easier to model than non-uniform doping profiles.

According to another aspect of the present invention, there is provided a MOSFET comprising a semiconductor device as described above.

BRIEF DESCRIPTION OF THE DRAWINGS

An embodiment of the present invention will now be described by way of example with reference to the accompanying drawings, in which.

DETAILED DESCRIPTION OF THE PREFERRED EMBODIMENTS

Figure 3:
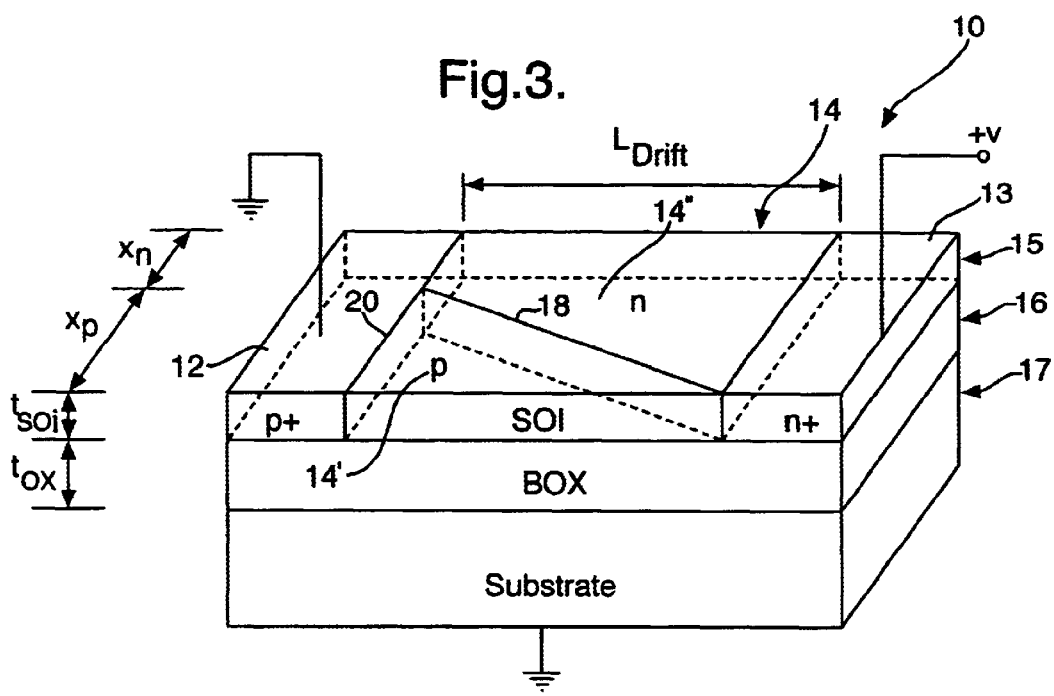
FIG. 3 is a schematic perspective view of an example of a semiconductor device according to an embodiment of the present invention.

Referring now to the drawings, FIG. 3 shows schematically a perspective view of an example of a diode structure 10 according to a preferred embodiment of the present invention. A p+ region 12 and an n+ region 13 are formed at opposed ends of the device 10 with a drift region 14 therebetween. The p+ region 12, n+ region 13 and drift region 14 are all formed in a semiconductor layer 15 which, in this example, is silicon. The silicon layer 15 is itself formed on an insulating buried oxide layer (BOX) 16 which itself is formed on a semiconductor substrate 17 which in this example is silicon, all as is known in SOI technology per se. Such a silicon layer 15 is conventionally referred to as the SOI layer 15. The drift region 14 in practical application of the present invention can form the drift regions and channel regions of a MOS-controllable device, as will be discussed further below.

The drift region 14 of this example is subdivided into two sub-regions 14',14". (In principle, it may be possible and even desirable to provide further sub-regions to the drift region 14.) The drift sub-regions 14',14" are so arranged such that when a reverse voltage bias is applied across the p+ region 12 and n+ region 13, an excess of charge is formed in one of the drift sub-regions 14" relative to the other drift sub-region 14' and further such that this excess of charge varies substantially linearly with distance from the p+ region 12. As will be discussed further below, this has the effect of ensuring that the vertical electric field at the SOI/BOX interface is proportional to the distance from the p+ region 12.

In the specific example shown in FIG. 3, this arrangement for the drift sub-regions 14',14" is achieved by the drift sub-regions 14',14" being opposite conductivity type and arranged such that a junction 18 between the drift sub-regions 14',14" lies at an acute angle to a line joining the p+ region 12 and the n+ region 13. The drift sub-regions 14',14" therefore effectively taper and when viewed from above typically have a generally triangular or trapezoidal shape. As shown in FIG. 3, the n drift sub-region 14" is orientated with its major portion or wide end 19 positioned towards the n+ region 13. Similarly, the major portion or wide end 20 of the p drift sub-region 14' is towards the p+ region 12. Each of the p and n drift sub-regions 14',14" preferably has a uniform doping profile.

As in a normal p/n junction, the p and n drift sub-regions 14',14" initially deplete transversely along the junction 18 on application of a reverse bias. However, due to the geometry of the drift sub-regions 14',14", the total charge in the p drift sub-region 14' is considerably less than that in the n drift sub-region 14". This compensates for the extra charge in the inversion layer below the buried oxide layer 16. By approximating the depletion of the p and n drift sub-regions 14',14" as a one-dimensional p/n junction, it can be seen that less and less charge in the n drift sub-region 14" is balanced out by the charge in the p drift sub-region 14' on progression from the grounded p+ region 12 to the n+ region 13. As will be understood, the effective charge/doping concentration in the SOI layer 15 once the p drift sub-region 14' is fully depleted is simply:

$$N_{n_{eff}}(x) = \frac{x_n - x_p}{L_{drift}} N_n \quad (3)$$

This in effect simulates a linearly graded doping profile and gives the desired linearly graded charge profile. Therefore, to achieve the ideal electric field distribution, it is necessary only to adjust the variables in the expression (3) so that it matches the expression (2) discussed above.

The main parameters that affect the breakdown voltage in such devices are (i) the thickness $t_{sol}$ of the SOI layer 15, (ii) the doping concentration $N_n$ of the n drift sub-region 14", (iii) the initial width $X_n, X_p$ of both the n and p drift sub-regions 14",14' as measured at the p+ region 12 end, and (iv) the length $L_{drift}$ of the drift region 14.

The first and most important parameter, the thickness $t_{SOI}$ of the SOI layer 15, has already been discussed above. It is found that in order to support high voltages in the oxide layer 16, a thin SOI layer 15 should be employed.

Figure 1:
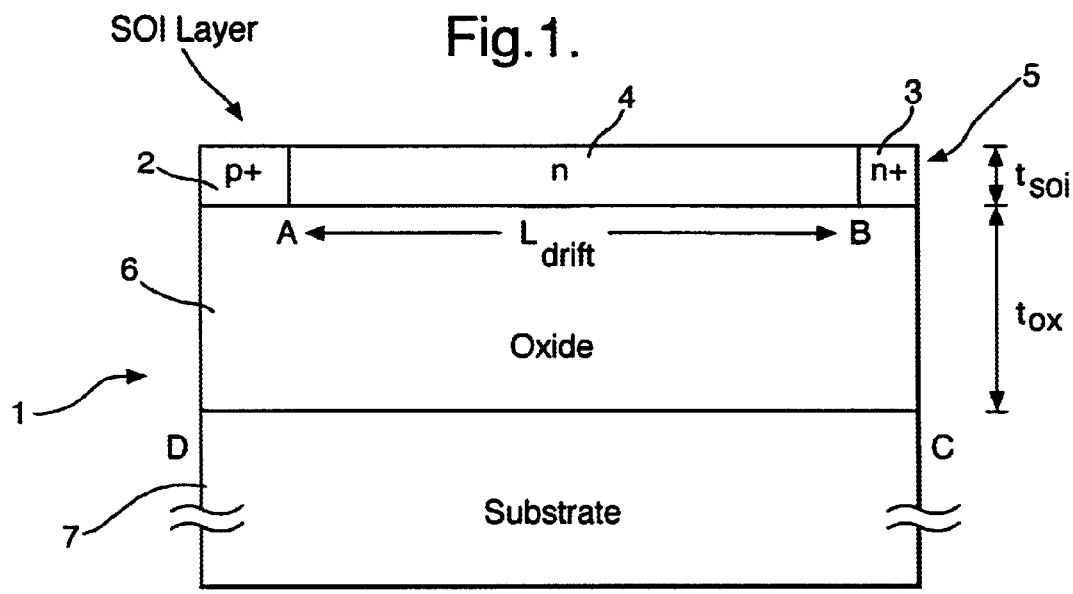
FIG. 1 shows schematically a basic diode structure as used in known high-voltage SOI devices.
Figure 2:
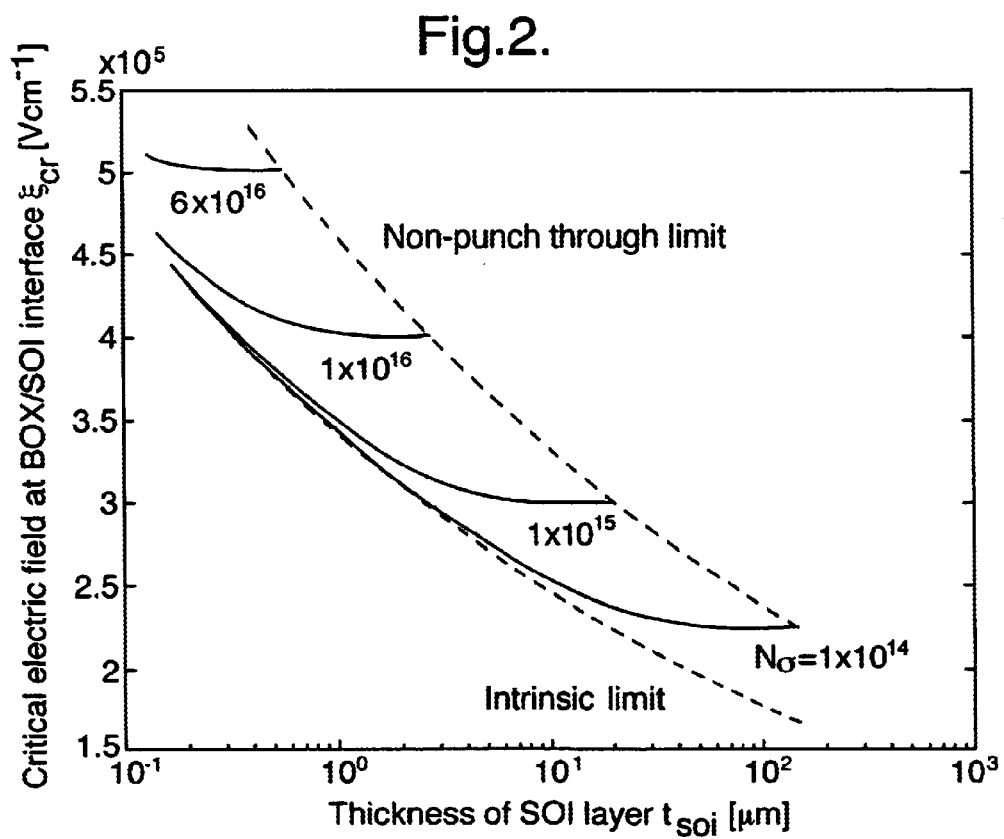
FIG. 2 shows graphically the dependence of the critical electric field in the SOI layer on thickness $t_{soi}$.

The second parameter determines the electric field enhancement at the SOI/BOX layer interface. From FIG. 2, it can be seen that increasing the doping concentration results in a larger critical electric field at the interface as compared to the case when the doping concentration in the SOI layer 15 is at the intrinsic level. The upper limit to which the doping concentration can be raised is dictated by the thickness $t_{SOI}$ of the SOI layer 15.

Figure 4:
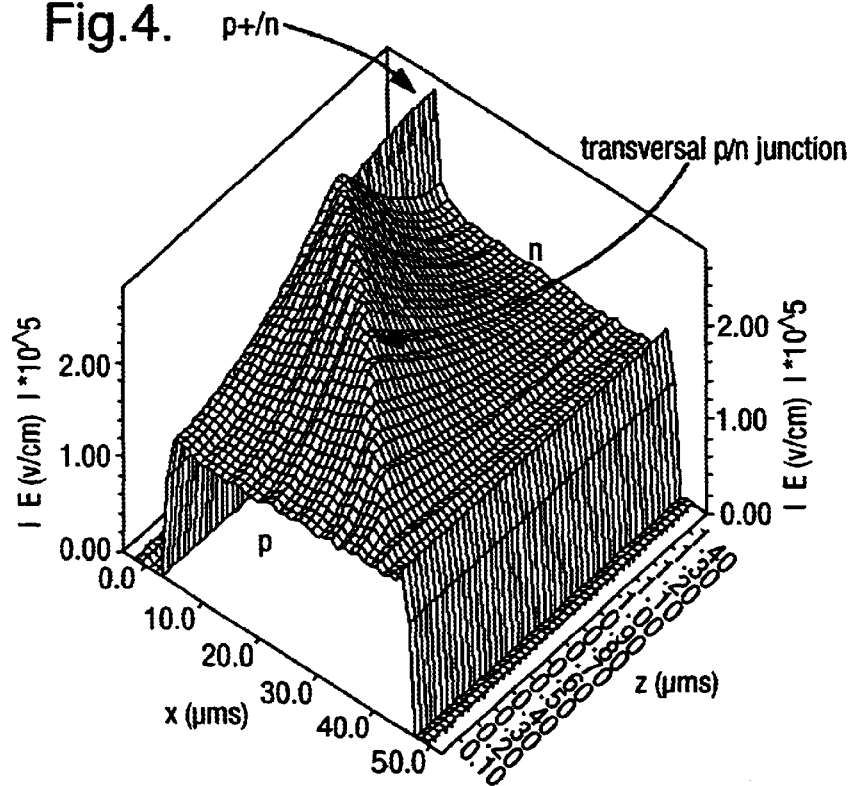
FIG. 4 shows schematically the electric field distributions at the surface of the SOI layer of the device of FIG. 3 just before avalanche breakdown.
Figure 5:
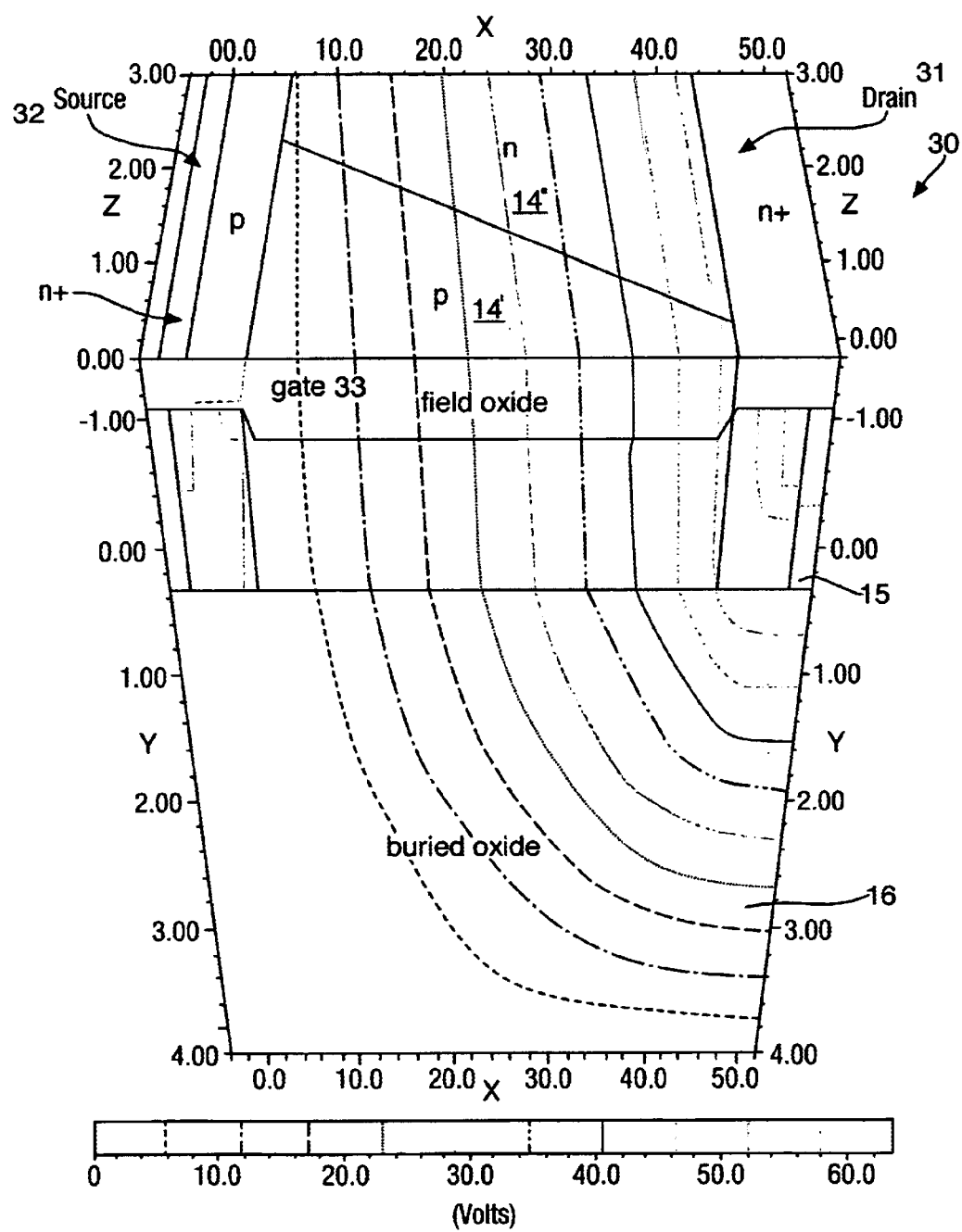
FIG. 5 shows schematically the potential line distribution at a breakdown voltage $V_{br}$=620V in an example of a MOSFET according to an embodiment of the present invention.
Figure 6:
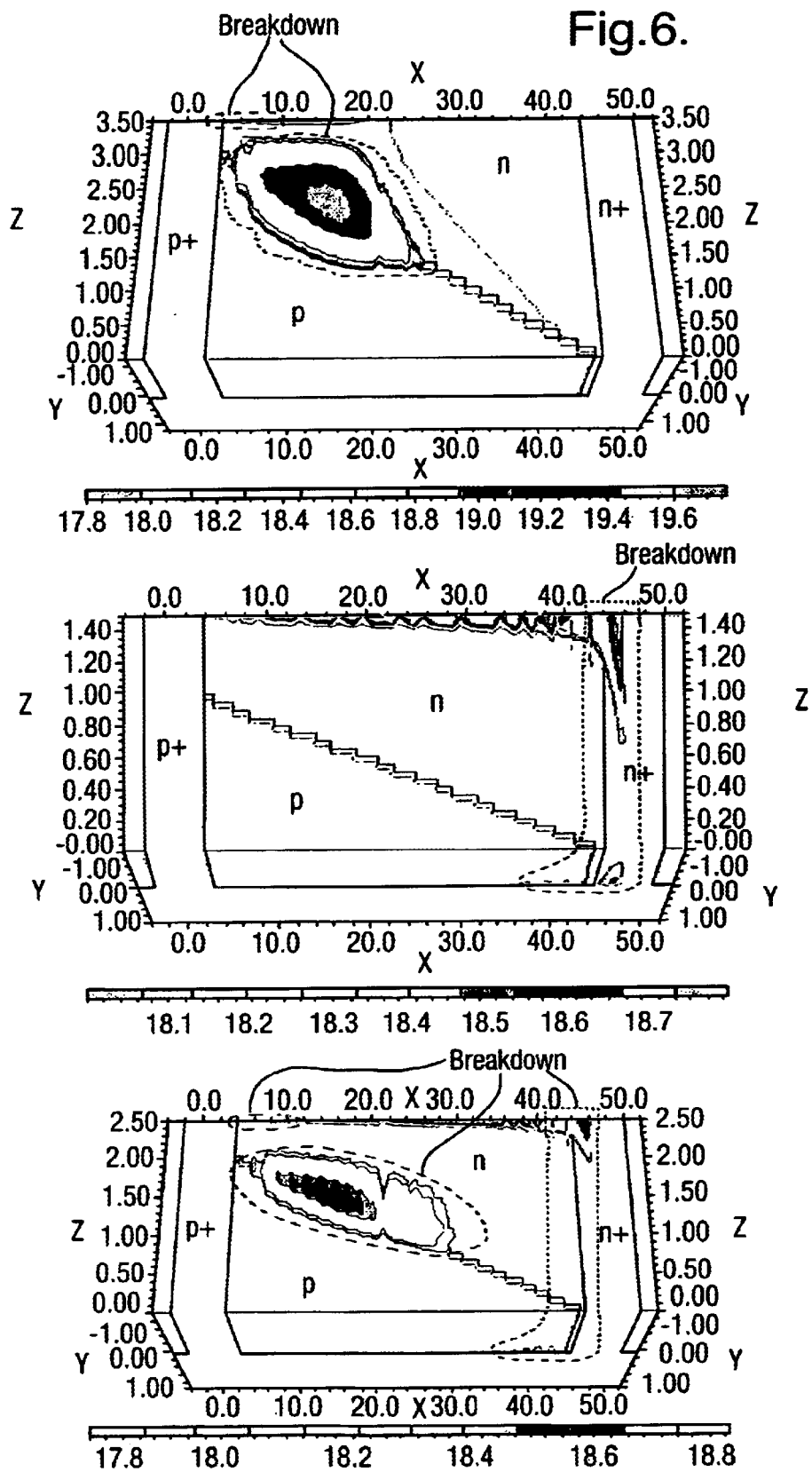
FIG. 6 shows schematically impact ionisation generation rates indicating shift of position of avalanche failure respectively from the p+/n junction and p/n drift region junction, to the SOI/BOX interface, and to the p+/n junction and p/n drift region junction and the SOI/BOX interface for optimised dimensions in which failure occurs throughout the bulk, for an example of a semiconductor device according to an embodiment of the present invention.

The third variable, which is the initial width of both the n and p drift sub-regions 14",14', in each case should not exceed a critical value determined by the doping concentrations of the n and p drift sub-regions 14",14' and especially that of the n drift sub-region 14". This is necessary to suppress breakdown across the oblique p/n junction 18 and to ensure full transversal depletion of the p and n drift sub-regions 14',14". The surface electric field distribution shown in FIG. 4 plotted just before breakdown for the device 10 of FIG. 3 indicates electric field peaks at (a) the corner of the p+/n junction 12/14" and (b) the portion of the p/n junction 18 nearer the p+ region 12. Additionally, as shown in FIG. 5 for an example of a MOSFET according to the present invention, potential lines crowding near the high voltage terminal 31 generate a large electric field at the SOI/BOX interface 15/16. Breakdown can initiate at any of these places. If the initial widths or doping concentrations of the n and p drift sub-regions 14",14' are too large, early breakdown occurs on the surface at the p+/n corner 12/14" and across the oblique p/n junction 18 as indicated by the impact ionisation generation rates shown in FIG. 6(a). By reducing the widths, breakdown can be shifted to the SOI/BOX interface 15/16 as shown in FIG. 6(b). In the optimised structure, avalanche occurs simultaneously at the p+/n junction 12/14", the oblique p/n junction 18 on the surface, and the SOI/BOX interface 15/16, as shown in FIG. 6(c).

Figure 7:
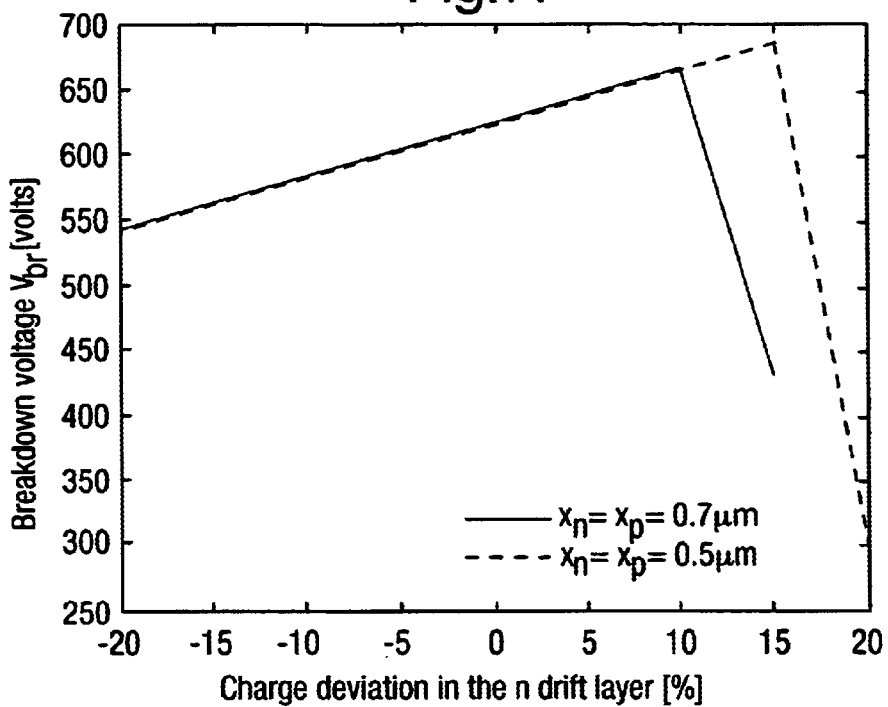
FIG. 7 shows schematically the dependence of the breakdown voltage on the deviation of the n drift region charge/doping density as a percentage of $3\times10^{16}$cm$^{-3}$ for an example of a semiconductor device according to an embodiment of the present invention.
Figure 8:
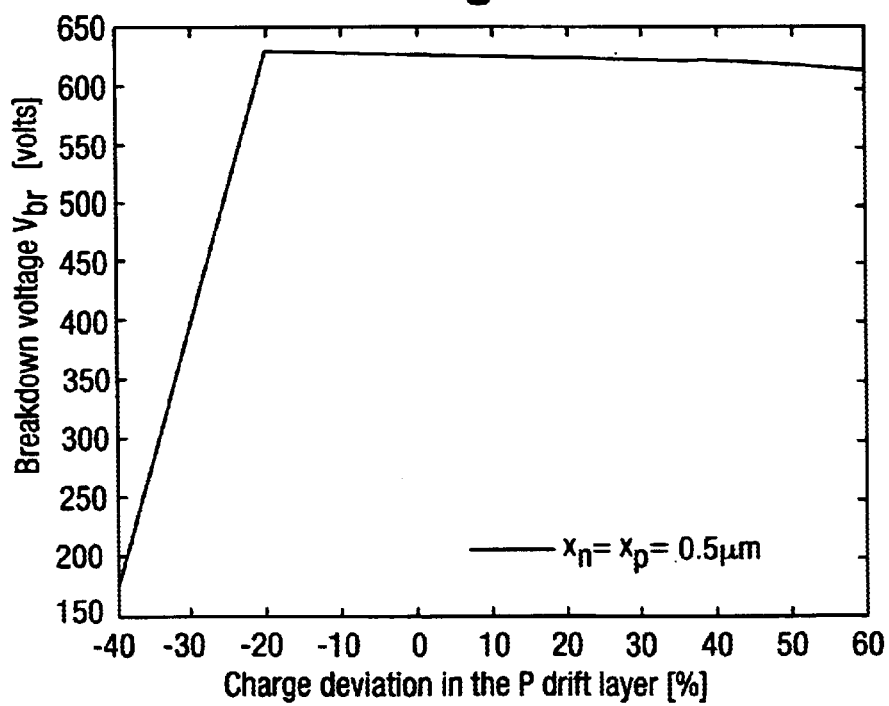
FIG. 8 shows schematically the dependence of the breakdown voltage on the deviation of the p drift region charge/doping density as a percentage of $3\times10^{16}$cm$^{-3}$ for an example of a semiconductor device according to an embodiment of the present invention.
Figure 9:
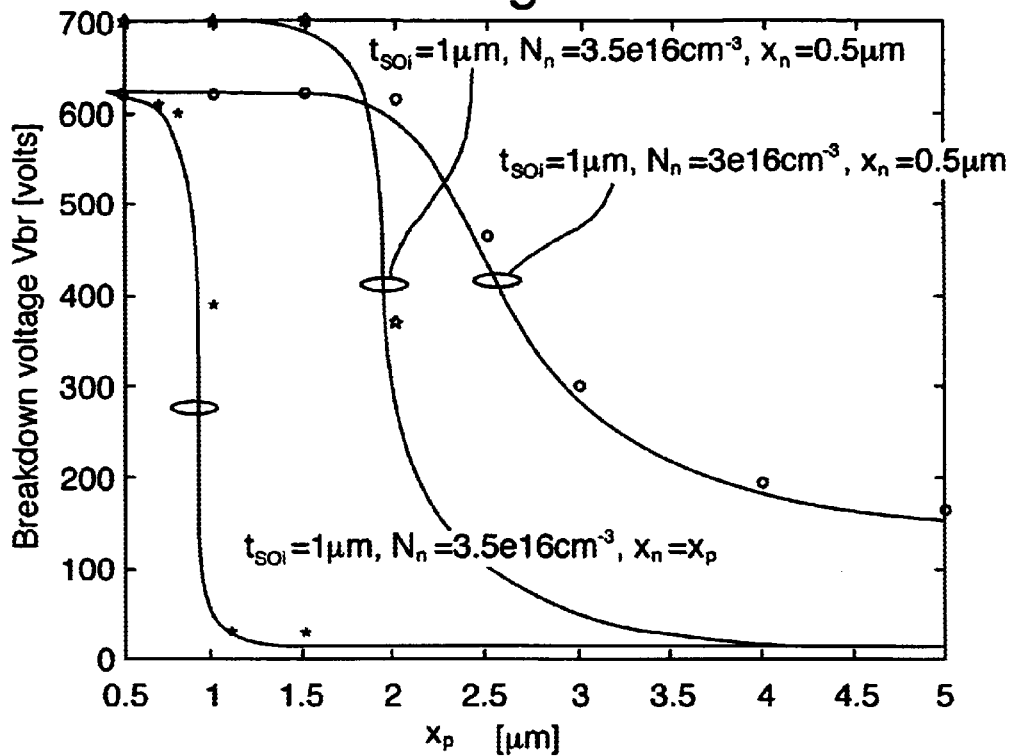
FIG. 9 shows graphically the influence of the initial width of the n and p drift regions on the breakdown voltage of an example of a diode according to an embodiment of the present invention.
Figure 10:
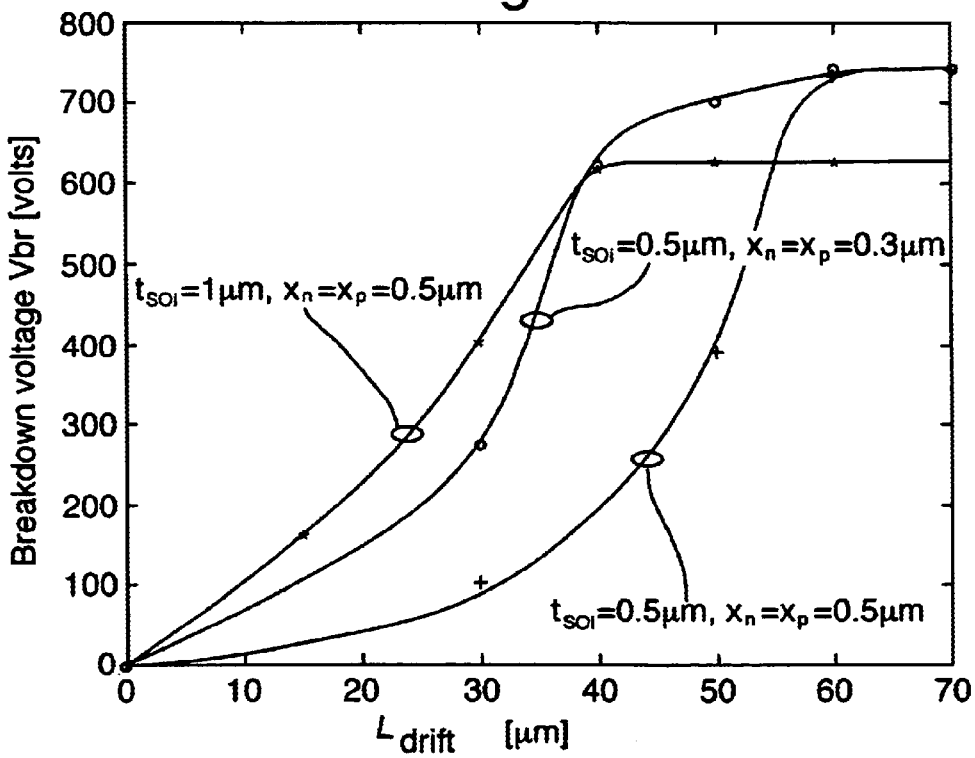
FIG. 10 shows graphically the influence of the drift length $L_{drift}$ on the breakdown voltage of an example of a diode according to an embodiment of the present invention.

The effect of charge imbalance in the n and p drift sub-regions 14",14' on the breakdown of the device 10 is shown in FIGS. 7 and 8 respectively for the case where $L_{drift}$ =40 μm, $t_{soi}$=1 μm, $t_{ox}$=4 μm and $x_n$,$x_p$=0.5 μm. FIG. 9 shows the influence of the initial width $x_n$,$x_p$ of the drift sub-regions 14",14' on the breakdown voltage for $L_{drift}$=40 μm, $t_{soi}$=1 μm, $t_{ox}$=4 μm and $N_n$=3×10$^{16}$cm$^{-3}$. FIG. 10 shows the variation of breakdown voltage with drift length $L_{drift}$ for $t_{ox}$=4 μm and the cases of $N_n$=3×10$^{16}$cm$^{-3}$ for $t_{soi}$=1 μm and $N_n$=7×10$^{16}$cm$^{-3}$ for $t_{soi}$=0.5 μm.

In summary, the fundamental requirement for a near uniform electric field distribution is that the vertical component of the electric field at the SOI/BOX interface increases proportionally with distance from the grounded end. Previously to achieve such an electric field distribution, a linearly graded profile was employed. In accordance with the preferred embodiment of the present invention, it will be recognised that the linearly graded profile can be dispensed with and the same effect achieved using uniform doping profiles by producing an effective charge/doping concentration in the SOI layer which increases linearly. In the preferred embodiment, the effective charge in the n drift region is varied by varying the width of both the p and n drift sub-regions from the p+ region connected to the low voltage terminal end to the n+ region connected to the reverse bias. To compensate for the effect of the mobile charge layer under the buried oxide, the n drift sub-region widens towards the high voltage terminal end whereas the p drift sub-region becomes narrower. In the preferred embodiment, this is achieved through the use of triangularly or trapezoidal shaped n and p drift sub-regions.

Figure 11:
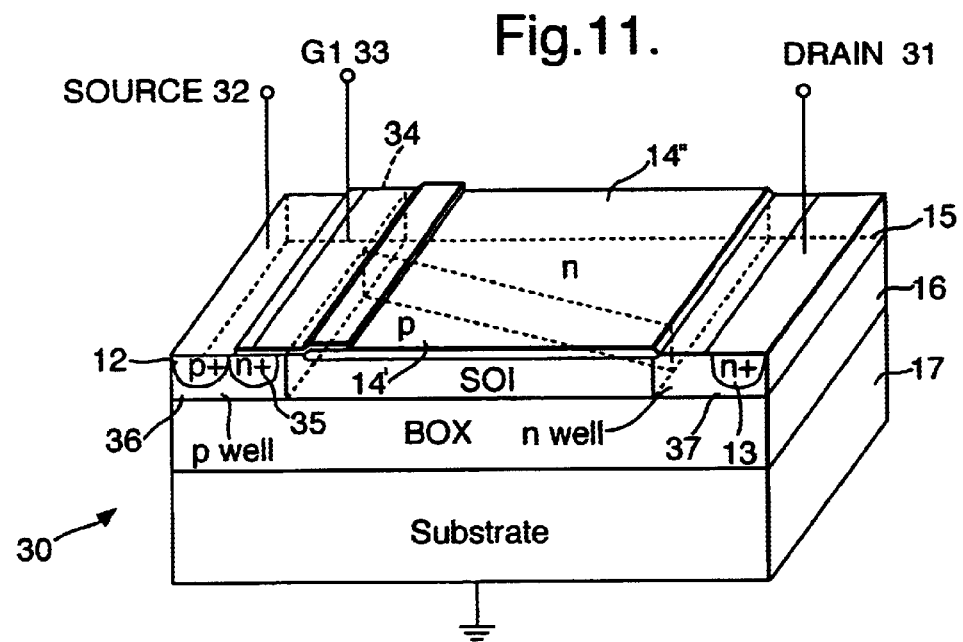
FIG. 11 is a schematic perspective view of an example of a single gate MOSFET according to an embodiment of the present invention.
Figure 12:
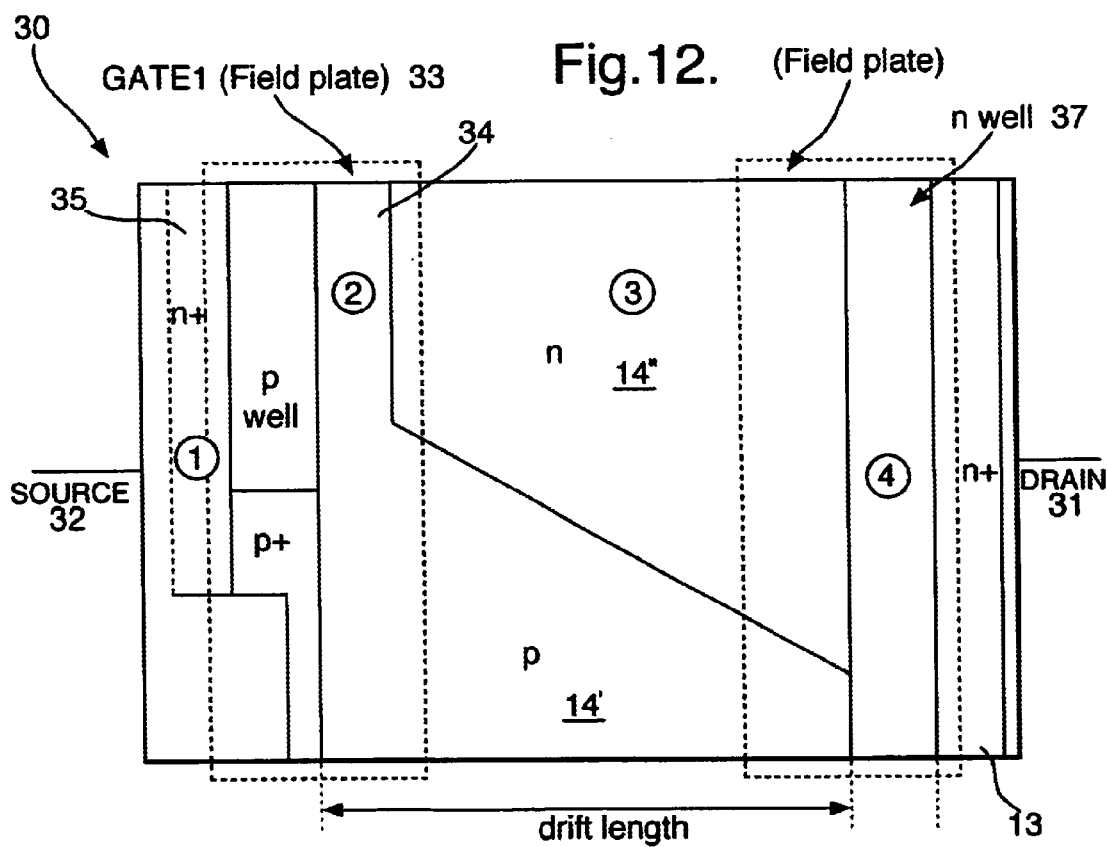
FIG. 12 is a schematic plan view from above of the MOSFET of FIG. 11.
Figure 13:
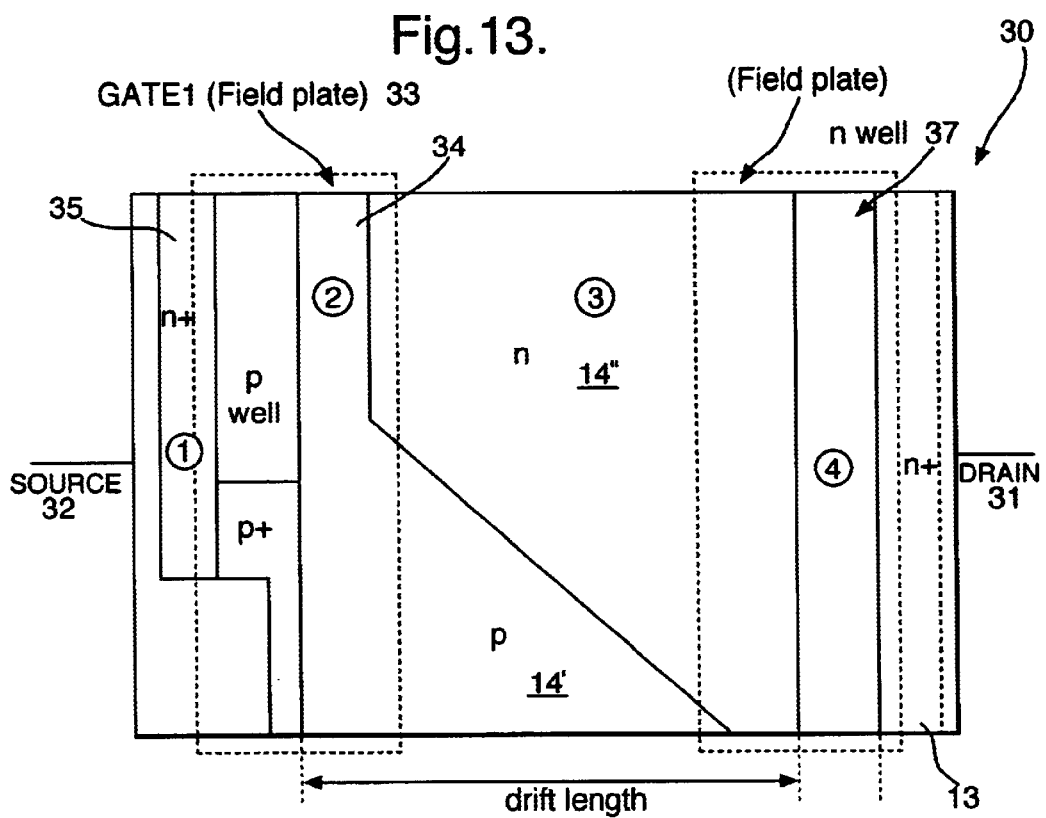
FIG. 13 is a schematic plan view from above of another example of an n-channel single gate MOSFET according to an embodiment of the present invention.

FIGS. 11 and 12 show schematically an n-channel single gate MOSFET 30 having trapezoidal p and n drift sub-regions 14',14". Similarly a single gate MOSFET having a triangular p drift sub-region 14' is shown schematically in FIG. 13. P-channel devices can be built by exchanging the positions of all the n and p type regions, as will be well understood.

In order to form a MOSFET, a MOSFET channel must be formed at the surface of the device. This can be accomplished by replacing part of the p+ region 12 of the device 10 shown in FIG. 3 with a p layer 34 just before the n drift sub-region 14" as shown schematically in FIGS. 11, 12 and 13. The usual n+ source 35 and p well 36 at the source end and the n well 37 at the drain end are also provided. In the forward blocking state, the interaction between the p/n junctions and the layer of mobile charge is similar to that described above. In the on state, the p layer 34 (region 2 in FIGS. 11 to 13) can be inverted by applying a potential higher than the threshold voltage to the MOSFET gate (G1) 33. Electrons will then flow from the n+ source 35 (region 1) through the channel formed in the p layer 34 (region 2), n drift sub-region 14" (region 3) to the drain region 13,37 (region 4) and the drain terminal 31.

To increase the conductivity of the drift region 14, the MOSFET gate (G1) 33 in the single gate version discussed above can be extended. The extended gate serves two distinct functions. In the blocking state, the extended gate is usually held at the same potential as the p region source end. Under this condition, the extended gate acts as a field plate much like the layer of mobile charge in the substrate beneath the buried oxide layer. By symmetry, either the doping concentrations in the p and n drift sub-regions are raised by almost a factor of two and the thickness of the SOI layer remains unchanged, or the doping concentrations in the p and n drift sub-regions remain unchanged but the thickness of the SOI layer is increased. In the on state, the extended portion of the gate forms a weak accumulation/inversion at the surface of the n/p drift sub-region layer. This helps to reduce the resistance along the current path.

There has thus been disclosed a technique for achieving high breakdown voltages on thin SOI layers (<3 μm) with a moderately thick buried oxide layer (≦4 μm) and which allow a uniform doping profile to be used. In the preferred embodiment, this is provided for by a structure having three main lateral junctions, two of which are parallel to each other and transverse to the line joining the p+ and n+ regions 12,13 in the SOI layer 15 and the third of which connects the other two and is at an acute angle thereto, each junction being formed in the SOI layer 15. Together with the mobile charge layer beneath the buried oxide layer 16, the parallel and transverse junctions realise a uniform distribution of the electric field in the off state.

An embodiment of the present invention has been described with particular reference to the examples illustrated. However, it will be appreciated that variations and modifications may be made to the examples described within the scope of the present invention. For example, whilst the junction 18 between the p and n drift sub-regions 14',14" is linear in the examples described above, the junction 18 may have another configuration, including for example curved or flared. In addition, the abutting edges of the p and n drift sub-regions 14',14" at the junction 18 need may have a shape such as stepped or serpentine or may have some irregular shape.

What is claimed is:

1. A lateral semiconductor device, the device comprising a semiconductor layer on an insulating layer on a semiconductor substrate, the semiconductor layer having a region of a first conduction type and a region of a second conduction type with a drift region therebetween, the drift region including a region of the first conduction type and a region of the second conduction type, the first and second conduction type drift regions being so arranged that when a reverse voltage bias is applied across the first and second conduction type regions of the semiconductor layer, the second conduction type drift region has an excess of charge relative to the first conduction type drift region that increases substantially linearly from the end of the drift region that is towards the first conduction type region of the semiconductor layer to the end of the drift region that is towards the second conduction type region of the semiconductor layer and such that the total charge in the second conduction type drift region is greater than the total charge in the first conduction type drift region.

2. A lateral semiconductor device according to claim 1, wherein the first conduction type drift region is substantially triangular or trapezoidal in shape parallel to the plane of the device.

3. A lateral semiconductor device according to claim 1, wherein the second conduction type drift region is substantially triangular or trapezoidal in shape parallel to the plane of the device.

4. A lateral semiconductor device according to claim 1, wherein the first conduction type drift region has substantially uniform doping.

5. A lateral semiconductor device according to claim 1, wherein the second conduction type drift region has substantially uniform doping.

6. A MOSFET comprising a semiconductor device according to claim 1.

7. A lateral semiconductor device, the device comprising a semiconductor layer on an insulating layer on a semiconductor substrate, the semiconductor layer having a region of a first conduction type and a region of a second conduction type with a drift region therebetween, the drift region being provided by a region of the first conduction type and a region of the second conduction type, a junction formed between the first and second conduction type drift regions lying at an acute angle to a line joining the first and second conduction type regions of the semiconductor layer with a major portion of the first conduction type drift region being towards the first conduction type region of the semiconductor layer and a major portion of the second conduction type drift region being towards the second conduction type region of the semiconductor layer, whereby when a reverse voltage bias is applied across the first and second conduction type regions of the semiconductor layer, the second conduction type drift region has an excess of charge relative to the first conduction type drift region that increases substantially linearly from the end of the drift region that is towards the first conduction type region of the semiconductor layer to the end of the drift region that is towards the second conduction type region of the semiconductor layer, the first and second conduction type drift regions being arranged such that the total charge in the second conduction type drift region is greater than the total charge in the first conduction type drift region.

8. A lateral semiconductor device according to claim 7, wherein the first conduction type drift region is substantially triangular or trapezoidal in shape parallel to the plane of the device.

9. A lateral semiconductor device according to claim 7, wherein the second conduction type drift region is substantially triangular or trapezoidal in shape parallel to the plane of the device.

10. A lateral semiconductor device according to claim 7, wherein the first conduction type drift region has substantially uniform doping.

11. A lateral semiconductor device according to claim 7, wherein the second conduction type drift region has substantially uniform doping.

12. A MOSFET comprising a semiconductor device according to claim 7.

13. A lateral semiconductor device, the device comprising a semiconductor layer on an insulating layer on a semiconductor substrate, the semiconductor layer having a region of a first conduction type and a region of a second conduction type with a drift region therebetween, the drift region being provided by a region of the first conduction type and an adjacent region of the second conduction type, the first and second conduction type drift regions each being tapered with a major portion of the first conduction type drift region being towards the first conduction type region of the semiconductor layer and a major portion of the second conduction type drift region being towards the second conduction type region of the semiconductor layer, whereby when a reverse voltage bias is applied across the first and second conduction type regions of the semiconductor layer, the second conduction type drift region has an excess of charge relative to the first conduction type drift region that increases substantially linearly from the end of the drift region that is towards the first conduction type region of the semiconductor layer to the end of the drift region that is towards the second conduction type region of the semiconductor layer, the first and second conduction type drift regions being arranged such that the total charge in the second conduction type drift region is greater than the total charge in the first conduction type drift region.

14. A lateral semiconductor device according to claim 13, wherein the first conduction type drift region is substantially triangular or trapezoidal in shape parallel to the plane of the device.

15. A lateral semiconductor device according to claim 13, wherein the second conduction type drift region is substantially triangular or trapezoidal in shape parallel to the plane of the device.

16. A lateral semiconductor device according to claim 13, wherein the first conduction type drift region has substantially uniform doping.

17. A lateral semiconductor device according to claim 13, wherein the second conduction type drift region has substantially uniform doping.

18. A MOSFET comprising a semiconductor device according to claim 13.

* * * * *